(12) United States Patent
Robison et al.

(10) Patent No.: US 11,656,108 B2
(45) Date of Patent: May 23, 2023

(54) SENSOR AND ASSOCIATED METHODS

(71) Applicant: Parker-Hannifin Corporation, Cleveland, OH (US)

(72) Inventors: Steve A. Robison, Vandalia, MI (US); Anand Hariharan, Guyton, GA (US); Kayon W. Chin, East Peoria, IL (US); Richard J. Evans, Morton, IL (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 17/830,467

(22) Filed: Jun. 2, 2022

(65) Prior Publication Data

US 2023/0061380 A1    Mar. 2, 2023

Related U.S. Application Data

(60) Provisional application No. 63/287,154, filed on Dec. 8, 2021, provisional application No. 63/237,879, filed on Aug. 27, 2021.

(51) Int. Cl.
| | |
|---|---|
| *G01D 11/24* | (2006.01) |
| *G01D 5/12* | (2006.01) |
| *H05K 3/30* | (2006.01) |
| *H05K 5/06* | (2006.01) |

(52) U.S. Cl.
CPC ............ *G01D 11/245* (2013.01); *G01D 5/12* (2013.01); *H05K 3/303* (2013.01); *H05K 5/06* (2013.01); *H05K 2203/1305* (2013.01)

(58) Field of Classification Search
CPC ........ G01D 11/245; G01D 5/12; H05K 3/303; H05K 5/06; H05K 2203/1305
See application file for complete search history.

(56) References Cited

U.S. PATENT DOCUMENTS

| | | | | |
|---|---|---|---|---|
| 8,034,652 | B2 * | 10/2011 | Nishida | H01L 21/6835 438/57 |
| 8,390,087 | B2 * | 3/2013 | Tu | H01L 27/14618 257/434 |
| 10,663,328 | B2 * | 5/2020 | Steinich | G01D 11/26 |
| 2008/0309805 | A1 * | 12/2008 | Chan | H01L 27/14618 348/294 |

FOREIGN PATENT DOCUMENTS

KR    20190065065 A    6/2019

\* cited by examiner

*Primary Examiner* — Jamel E Williams
(74) *Attorney, Agent, or Firm* — McDonnell Boehnen Hulbert & Berghoff LLP

(57) ABSTRACT

An example sensor includes a PCB mounted in an internal chamber of housing, wherein the PCB comprises calibration electrical contact points; a sealing grommet mounted in the internal chamber, wherein the sealing grommet comprises an axial hole aligned with the calibration electrical contact points, thereby providing access to the calibration electrical contact points of the PCB; a grommet plug disposed in the axial hole of the sealing grommet; a sensing element disposed in the housing and electrically-coupled to the PCB via an electrical connection; an encapsulant sealing material deposited on the sealing grommet and the grommet plug; and an external cable connected to the PCB and extending through the sealing grommet and through the encapsulant sealing material.

20 Claims, 11 Drawing Sheets

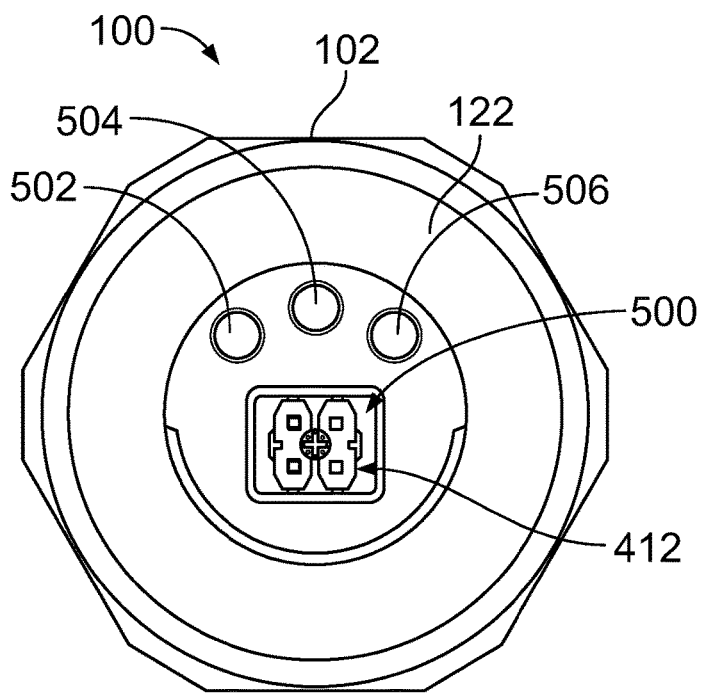
FIG. 5
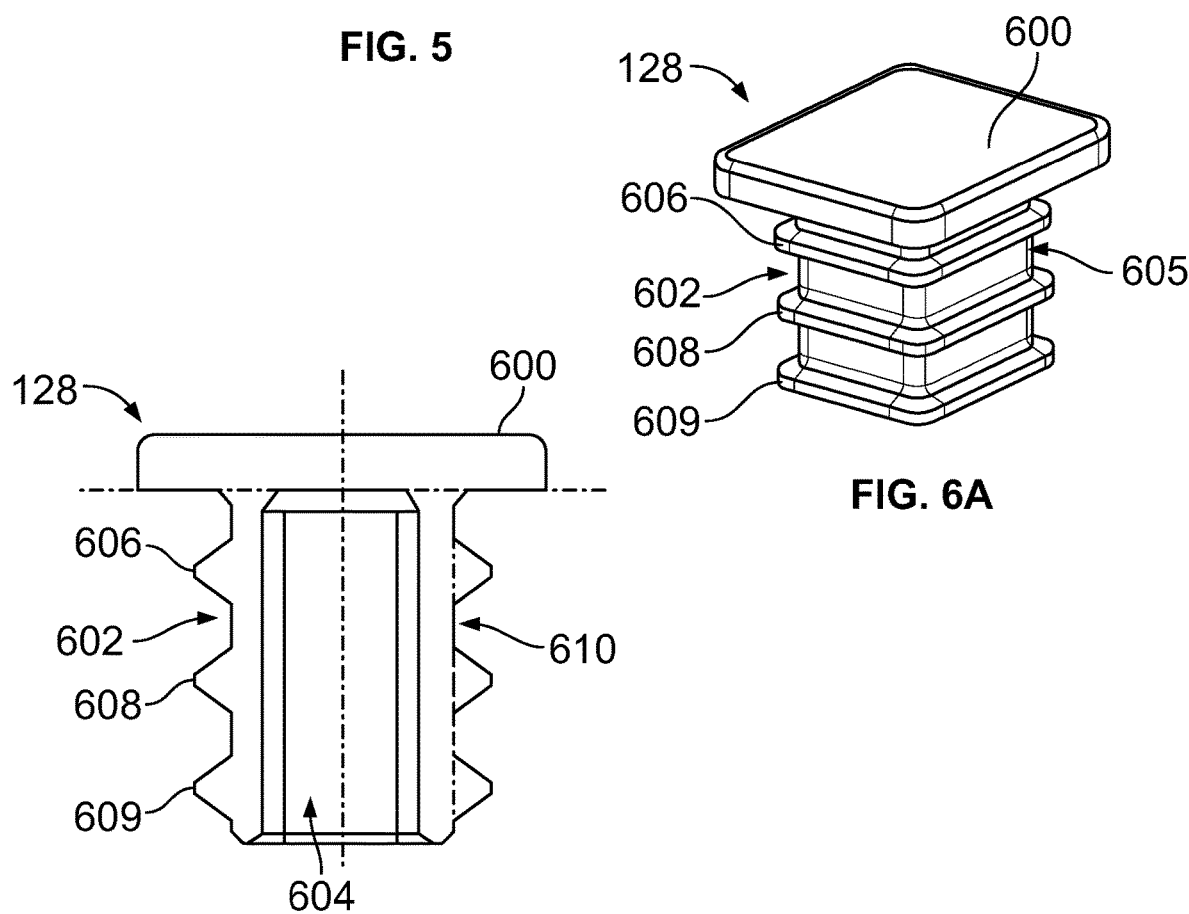
FIG. 6A
FIG. 6B

PLACING THE GROMMET PLUG IN THE AXIAL HOLE OF THE SEALING GROMMET SUCH THAT THE GROMMET PLUG RECEIVES THE PLURALITY OF CONDUCTIVE PINS IN A BLIND HOLE OF THE GROMMET PLUG — 1000

FIG. 10

INSERTING A PROJECTION OF THE GROMMET PLUG IN THE AXIAL HOLE OF THE SEALING GROMMET SUCH THAT THE GROMMET PLUG RECEIVES A PORTION OF THE CALIBRATION CONNECTOR WITHIN THE PROJECTION — 1100

FIG. 11

INSERTING THE PROJECTION OF THE GROMMET PLUG INTO THE AXIAL HOLE OF THE SEALING GROMMET SUCH THAT THE INTERIOR SURFACE OF THE SEALING GROMMET BOUNDING THE AXIAL HOLE GRIPS ONE OR MORE CIRCUMFERENTIAL TAPERED RIDGES OF THE PROJECTION AND FORMS A SEAL AT AN INTERFACE BETWEEN THE GROMMET PLUG AND THE SEALING GROMMET — 1200

FIG. 12

| MOUNTING A RETAINING RING IN THE INTERNAL CHAMBER TO THE SEALING GROMMET TO RETAIN THE SEALING GROMMET IN AN AXIAL DIRECTION | 1600 |

FIG. 16

| WHEREIN AN EXTERIOR SURFACE OF THE SEALING GROMMET IS COLLARED, AND WHEREIN POSITIONING THE SEALING GROMMET IN THE INTERNAL CHAMBER OF THE HOUSING COMPRISES: POSITIONING THE SEALING GROMMET IN THE INTERNAL CHAMBER OF THE HOUSING SUCH THAT THE EXTERIOR SURFACE OF THE SEALING GROMMET GRIPS AN INTERIOR SURFACE OF THE HOUSING | 1700 |

FIG. 17

SENSOR AND ASSOCIATED METHODS

CROSS REFERENCE TO RELATED APPLICATION

The present application claims priority to U.S. Provisional Application No. 63/237,879 filed on Aug. 27, 2021 and U.S. Provisional Application No. 63/287,154 filed on Dec. 8, 2021, the entire contents of all of which are herein incorporated by reference as if fully set forth in this description.

TECHNICAL FIELD

This disclosure relates to a sensor with enhanced sealing, rendering the sensor robust to its environment, with the sensor additionally being configured to provide access to calibration points of electronic components of the sensor during production, while preventing access to the calibration points in the sensor final form.

BACKGROUND

Machines, such as off-road mobile machines, are continually exposed to environmental factors like sun, wind, rain, extreme temperatures, changes in barometric pressures, dirt, fluids, mud, etc. Electrical sensors on the machine must be robust to the environment and continually operate regardless of the environmental factors. Similarly, sensors used in industrial facilities can be subjected to rough environments with many contaminants. It may thus be desirable to ensure that the sensor is robust to its external environment, so that the sensor continues to operate regardless of environment factors.

Further, it some cases, electronic components of the sensor are calibrated during production, but it may be desirable to preclude access to the calibration points of the sensor once the sensor is in its final form and being used in an application. In conventional systems, wires are connected to the calibration points, and are then cut off, and the sensor is sealed at the points where the wires extended to internal components of the sensor. This configuration may cause the sensor to be vulnerable to contaminants in its environments. It is with respect to these and other considerations that the disclosure made herein is presented.

SUMMARY

The present disclosure describes implementations that relate to a sensor and associated methods.

In a first example implementation, the present disclosure describes a sensor. The sensor includes: a housing having an internal chamber; a printed circuit board (PCB) mounted in the internal chamber of the housing, wherein the PCB comprises one or more calibration electrical contact points; a sealing grommet mounted in the internal chamber, wherein the sealing grommet comprises an axial hole aligned with the calibration electrical contact point, thereby providing access to the calibration electrical contact point of the PCB; a grommet plug disposed in the axial hole of the sealing grommet; a sensing element disposed in the housing and electrically-coupled to the PCB via an electrical connection; an encapsulant sealing material deposited on the sealing grommet and the grommet plug, wherein the grommet plug is configured to seal the axial hole to preclude the encapsulant sealing material from flowing through the axial hole, and to preclude access to the calibration electrical contact points once the encapsulant sealing material is deposited; and an external cable connected to the PCB and extending through the sealing grommet and through the encapsulant sealing material.

In a second example implementation, the present disclosure describes a method. The method includes: mounting a sensing element within a housing of a sensor; mounting a printed circuit board (PCB) in an internal chamber formed within the housing, wherein the sensing element is electrically-coupled to the PCB via an electrical connection, and wherein the PCB comprises a plurality of electronic components and one or more calibration electrical contact points for calibrating one or more electronic components of the plurality of electronic components; positioning a sealing grommet in the internal chamber of the housing, wherein the sealing grommet comprises an axial hole aligned with the calibration electrical contact points, thereby providing access to the calibration electrical contact points of the PCB, wherein an external cable is connected to the PCB and extends through the sealing grommet; calibrating the one or more electronic components of the PCB by accessing the calibration electrical contact points via the axial hole of the sealing grommet; placing a grommet plug in the axial hole of the sealing grommet; and depositing an encapsulant sealing material on the sealing grommet and the grommet plug such that the external cable extends through the encapsulant sealing material outside of the housing, wherein the grommet plug is configured to seal the axial hole to preclude the encapsulant sealing material from flowing through the axial hole, and wherein the encapsulant sealing material and the grommet plug are configured to seal the PCB and preclude further access to the calibration electrical contact points.

The foregoing summary is illustrative only and is not intended to be in any way limiting. In addition to the illustrative aspects, implementations, and features described above, further aspects, implementations, and features will become apparent by reference to the figures and the following detailed description.

BRIEF DESCRIPTION OF THE FIGURES

FIG. 5 illustrates a partial top view of the sensor of FIG. 1, in accordance with an example implementation.

FIG. 6A illustrates a perspective view of a grommet plug, in accordance with an example implementation.

FIG. 6B illustrates a cross-sectional elevational side view of the grommet plug of FIG. 6A, in accordance with an example implementation.

FIG. 10 is a flowchart of additional operations performed with the method of FIG. 9, in accordance with an example implementation.

FIG. 11 is a flowchart of additional operations performed with the method of FIG. 9, in accordance with an example implementation.

FIG. 12 is a flowchart of additional operations performed with the method of FIG. 9, in accordance with an example implementation.

FIG. 16 is a flowchart of additional operations performed with the method of FIG. 9, in accordance with an example implementation.

FIG. 17 is a flowchart of additional operations performed with the method of FIG. 9, in accordance with an example implementation.

DETAILED DESCRIPTION

Disclosed herein are sensors with enhanced sealing, rendering the sensors robust to their environment. The sensors are also configured to provide access to calibration points during production, while precluding access to the calibration points in a sealed manner once the sensor is in its final assembled form.

Particularly, an example sensors may have a sealing grommet that provides access to calibration terminals on a printed circuit board (PCB) of the sensor. Once calibration is performed, a grommet plug is used to cover the calibration terminals. Further, a primary encapsulant seal is then used to seal the sensor, providing enhanced additional sealing and precluding access to, or exposure of, the calibration terminals.

Figure 1:
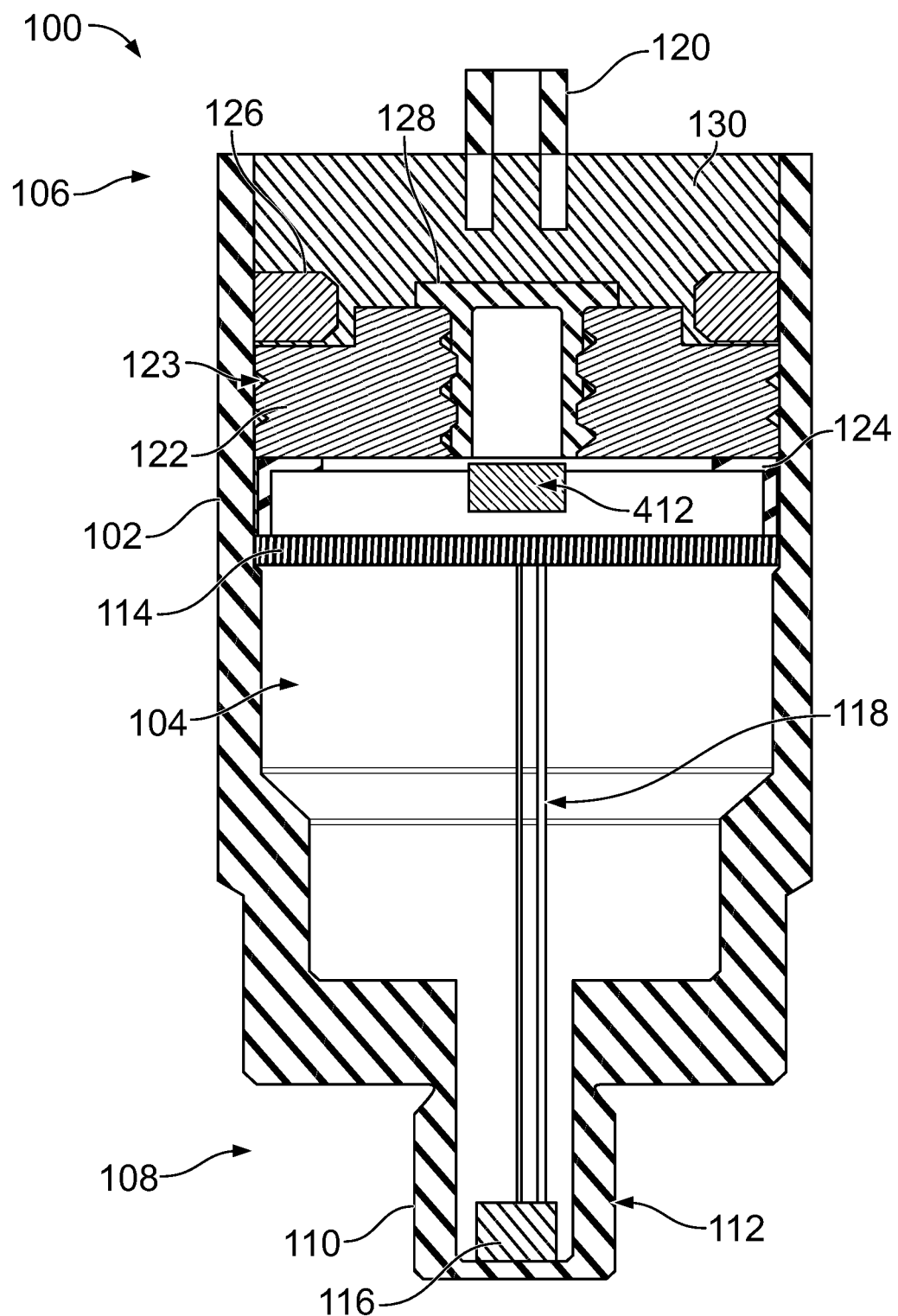
FIG. 1 illustrates a cross-sectional elevational view of a sensor, in accordance with an example implementation.
Figure 2:
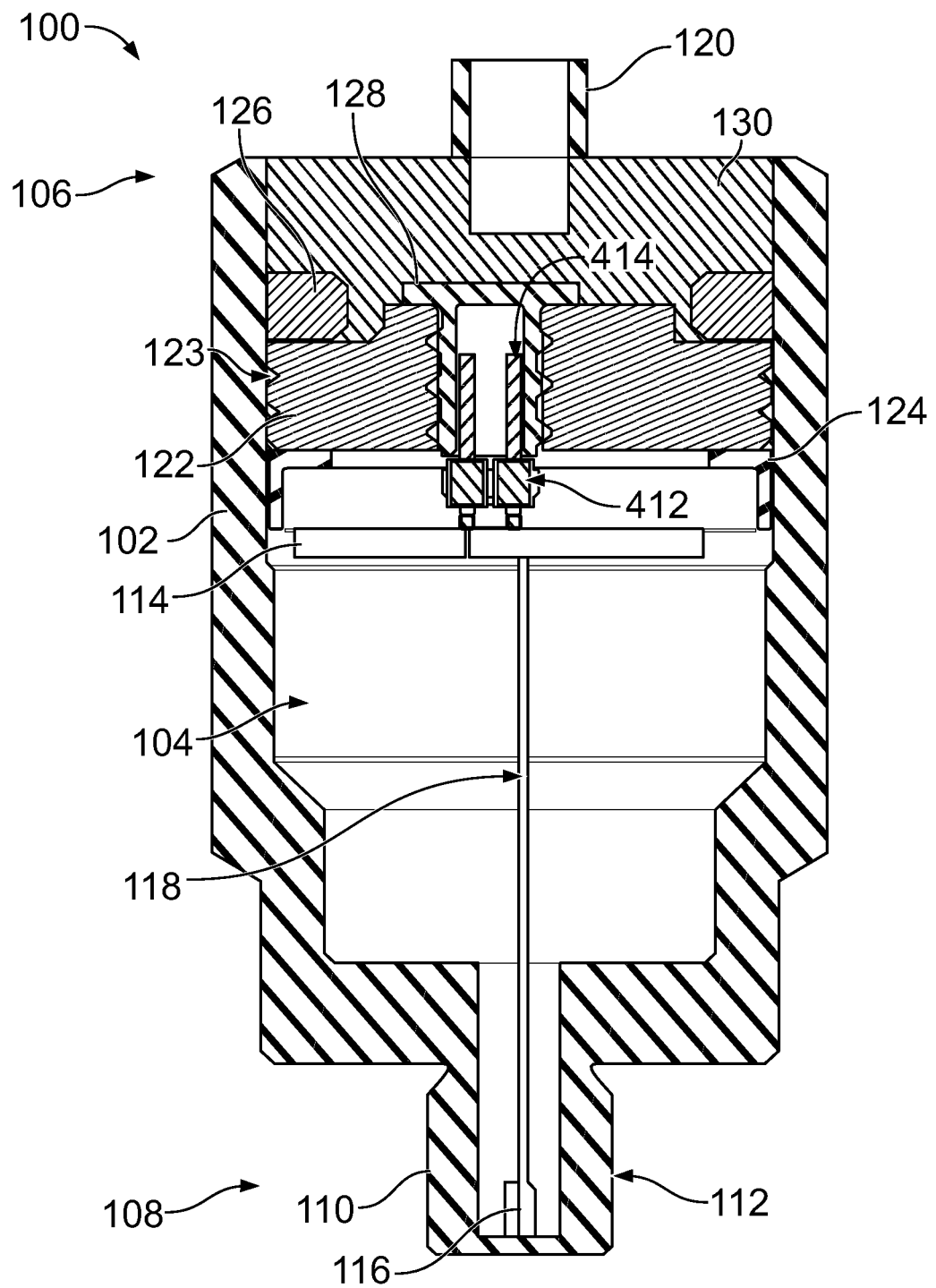
FIG. 2 illustrates another cross-sectional elevational view of the sensor of FIG. 1, in accordance with an example implementation.
Figure 3:
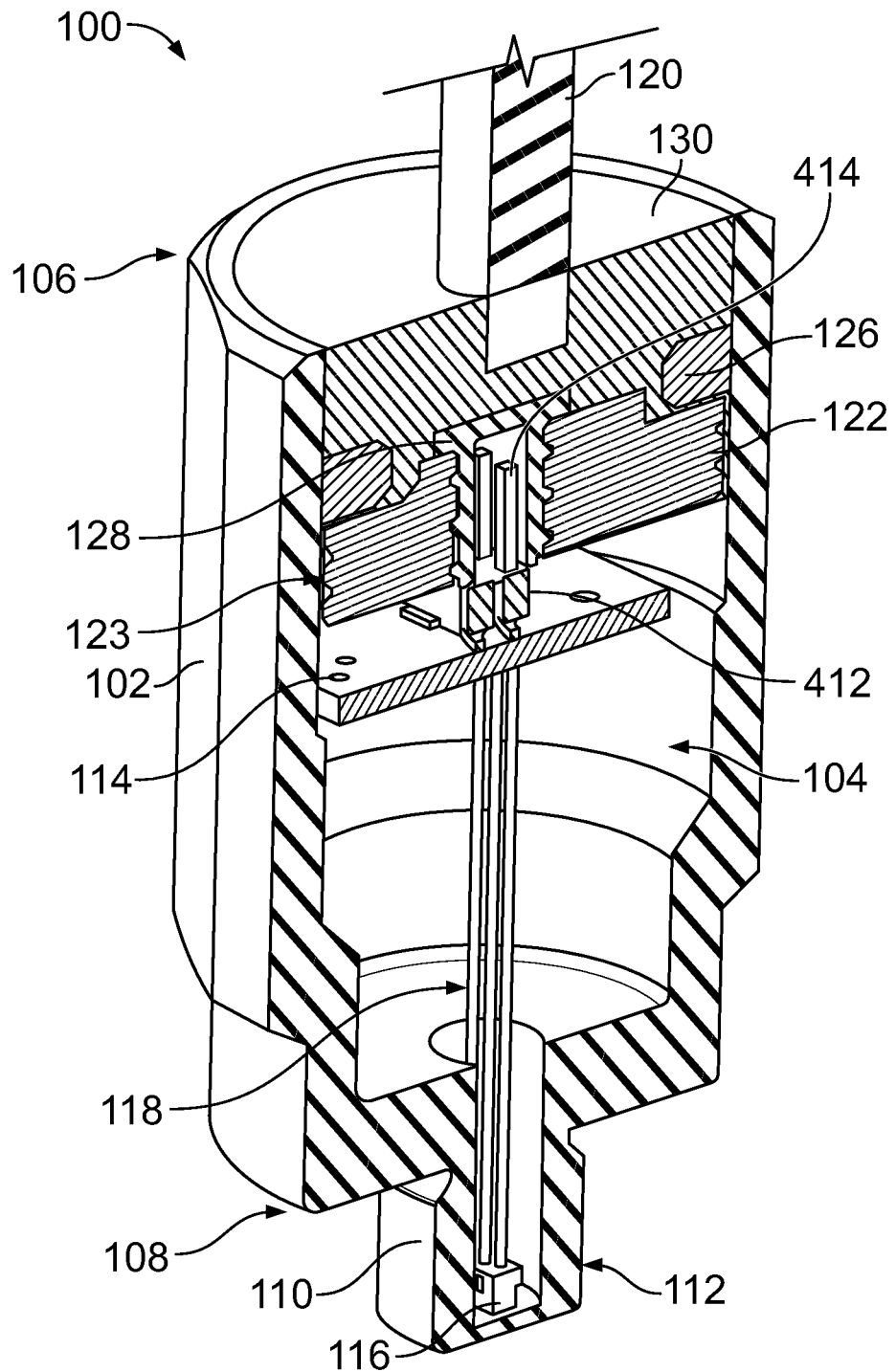
FIG. 3 illustrates a perspective cross-sectional view of the sensor of FIG. 1, in accordance with an example implementation.

FIG. 1 illustrates a cross-sectional elevational view of a sensor 100, FIG. 2 illustrates another cross-sectional elevational view of the sensor 100, and FIG. 3 illustrates a perspective cross-sectional view of the sensor 100, in accordance with an example implementation. FIGS. 1-3 are described together.

The sensor includes a housing 102. In an example, the housing 102 can be generally-cylindrical in shaped. In another example, the housing 102 can have a hexagonally-shaped body that facilitates mounting to another component and rotating the housing 102 via a wrench or other tool to couple the housing 102 to the component (e.g., via threads as described below).

The housing 102 has or defines an internal chamber 104 therein in which components and materials of the sensor 100 are disposed. The housing 102 has a first end 106 that is open to facilitate inserting components and materials of the sensor 100. The housing 102 also has a second end 108, opposite the first end, and the second end 108 can be referred to as the mounting end.

For example, the housing 102 can have a neck portion or protrusion 110 at the second end. The protrusion 110 can have threads 112 disposed about its exterior surface. The threads 112 facilitate mounting the sensor 100 to a machine, system, manifold, component, fluid line, etc. For example, the machine or other receiving component can have a threaded hole, and the protrusion 110 can be inserted into such hole, and the housing 102 is rotated to threadedly engage the threads 112 of the protrusion 110 with the internal threads of the hole, thereby coupling the sensor 100 to the receiving component.

The sensor 100 also includes a printed circuit board (PCB) 114 mounted within the internal chamber 104 of the housing 102. For example, the PCB 114 can be positioned on a portion of the housing 102 having a smaller diameter forming a shelf or shoulder for the PCB 114 to be mounted or positioned within the housing 102.

The PCB 114 mechanically supports and electrically connects electronic components (e.g., microprocessors, integrated chips, capacitors, resistors, potentiometers, etc.) of the sensor 100 using conductive tracks, pads, and other features etched from one or more sheet layers of copper laminate onto and/or between sheet layers of a nonconductive substrate. Components are generally soldered onto the PCB 114 to both electrically connect and mechanically fasten them to it.

The electronic components of the PCB 114 receive signals from a sensing element 116 mounted at the second end 108 of the housing 102 via an electrical connection (e.g., cable, individual wires, flexible cables, etc. For example, the sensing element 116 is electrically-coupled to the PCB 114 via a sensing element cable 118. The term "cable" is used herein to indicate one or more wires.

The electronic components of the PCB 114 then process the signal (e.g., adjust, offset, or scale the signal, map the signal to a value, etc.) to provide an output signal that is usable by an external component (e.g., a controller or a computing device of a machine, a monitoring computing device, etc.). Other wires or cable (e.g., external cable 120 described below) is connected to the PCB 114 to provide the output signal to the external component.

Figure 4A:
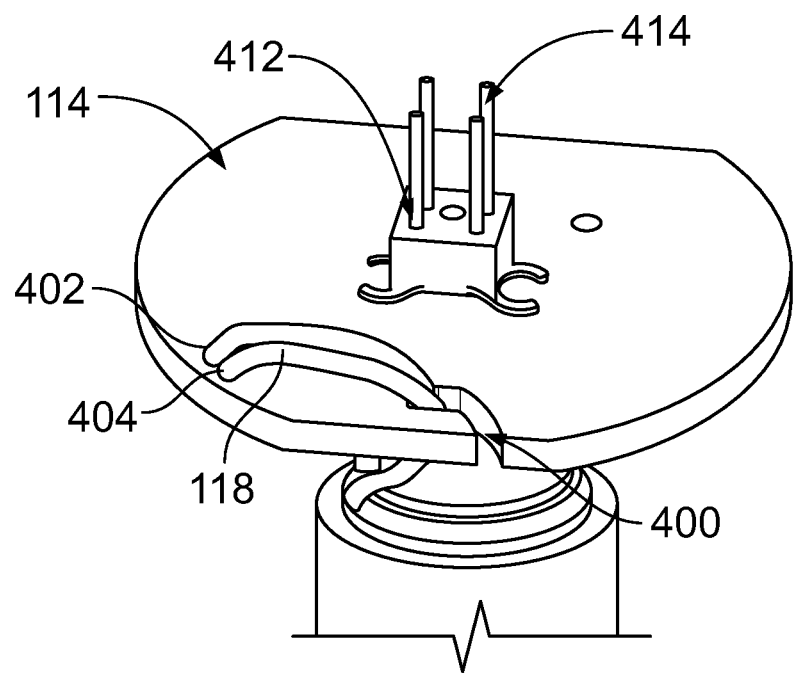
FIG. 4A illustrates a perspective view of a printed circuit board of the sensor of FIG. 1, in accordance with an example implementation.
Figure 4B:
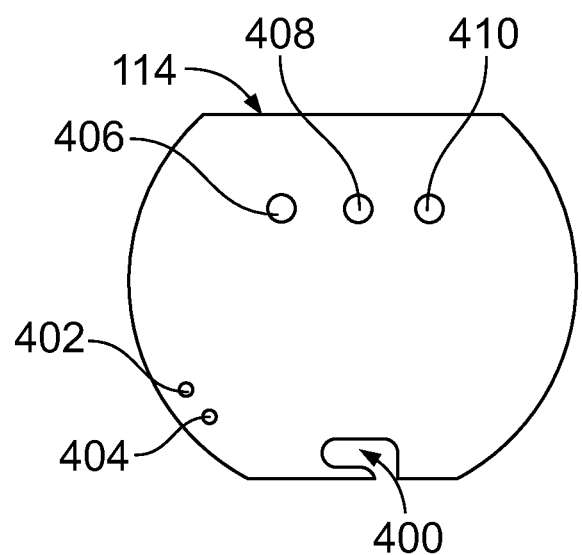
FIG. 4B illustrates a top view of the printed circuit board of FIG. 4A, in accordance with an example implementation.

FIG. 4A illustrates a perspective view of the PCB 114, and FIG. 4B illustrates a top view of the PCB 114, in accordance with an example implementation. Referring to FIGS. 4A-4B together, the PCB 114 has a slot 400 through which the sensing element cable 118 from the sensing element 116 is routed. Wires of the sensing element cable 118 can then be soldered to a first set of conductive points including conductive point 402 and conductive point 404 of the PCB 114, for example. The signal from the sensing element cable 118 is then provided to other electronic components (not shown) mounted to the PCB 114 (e.g., microprocessors, integrated chips, capacitors, resistors, potentiometers, etc.) using conductive tracks (not shown to reduce visual clutter in the drawings).

The PCB 114 can further include a second set of conductive points including conductive point 406, conductive point 408, and conductive point 410. The conductive points 406-408 can be coupled or soldered to wires that are then routed to external cable 120 shown in FIGS. 1-3. For example, one of the conductive points 406-410 can be soldered to a wire providing electric power to the PCB 114, another conductive point of the conductive points 406-410 can be soldered to a wire connected to earth ground. Further, after the signal from the sensing element 116 is processed, and the electronic components of the PCB 114 generate an output signal, the output signal can be provided to the third conductive point of the conductive points 406-410.

The PCB 114 further includes one or more calibration electrical contact points (e.g., conductive terminals, a conductive pad on the PCB 114, conductive points on the PCB 114, or a connector having a header mounted to the PCB 114 and conductive pins protruding therefrom, etc.) that facilitate calibrating electronic components of the PCB 114. For example, the calibration electrical contact points can comprise a calibration connector 412. In an example, the calibration connector 412 can be a four-pin electric connector having four conductive pins 414. This type of electric connector is used as an example for illustration, and other types of connectors having a different number or plurality of conductive pins can be used.

The calibration connector 412 provides access to electronic components (e.g., potentiometers) of the PCB 114 to calibrate the electronic components. For example, the PCB 114 can include one or more potentiometers. An example analog potentiometer is a three-terminal resistor with a sliding or rotating contact that forms an adjustable voltage divider. If only two terminals are used, one end and the wiper, it acts as a variable resistor or rheostat. Alternatively, the PCB 114 can include digital potentiometers. A digital potentiometer is an electronic component that mimics the functions of analog potentiometers. Through digital input signals, the resistance between two terminals can be adjusted, just as in an analog potentiometer.

It may be desirable to calibrate such potentiometers during production of the sensor 100. The calibration is the process of checking the accuracy of the signal generated by the sensor 100 or one of its components by comparing it with a standard or desired value. In other words, calibration checks the correctness of the signal by comparing it with the reference value. For instance, the sensor 100 can be used to measure one or more known quantities (e.g., position, speed, pressure, vibration frequency or magnitude, etc.), and the output of the sensor 100 is compared to the known quantity. If there are discrepancies, parameters of the electronic components of the PCB 114 (e.g., gains, offsets, resistances of potentiometers, etc.) can be adjusted until the expected value is generated.

In another example, a potentiometer can provide an electrical signal that is then used as an input signal to another component or control loop. For example, if the sensing element 116 is configured to measure position of a moving member, the potentiometer can produce a voltage signal indicative of the position or speed of travel. The magnitude of volts per inch or foot of travel can be referred to as a calibration factor that is set by the potentiometer, for example. The process to calculate or set the calibration factor is a calibration of the potentiometer. The calibration factor can be used in an application control software to add or subtract out the linearity error to meet specification, for example. The calibration process may also depend on the fraction of the full potentiometer range used. Further, proportionality or linearity of the output voltage signal can be changed by adjusting parameters of the potentiometer.

The conductive pins 414 of the calibration connector 412 provide access to the electronic components of the PCB 114 and provide the capability to adjust the parameters of the electronic components to calibrate the sensor 100 during production. Once calibration is completed, the sensor 100 is configured such that the sensor 100 is robustly sealed, and access to the calibration connector 412 is no longer available.

Referring back to FIGS. 1-3, the sensor 100 further includes a sealing grommet 122. The sealing grommet 122 is configured as a ring-shaped or annular bushing that is inserted through the first end 106 of the housing 102. Particularly, the sealing grommet 122 is positioned between the PCB 114 and first end 106 of the housing 102. As an example, the sealing grommet 122 can be a molded rubber bushing that is inserted into the housing 102. However, in other examples, the sealing grommet 122 can be made of metal or plastic.

Further, as depicted in FIGS. 1-3, an exterior surface of the sealing grommet 122 can be flared or collared to keep the sealing grommet 122 in place. For example, the seal grommet 122 has collars 123 (e.g., circumferential rings or ridges separated by grooves or troughs) to facilitate gripping the interior surface of the housing 102 and maintaining a position of the sealing grommet 122.

In an example, the sensor 100 can include a washer or a spacer ring 124 disposed in the internal chamber 104 of the housing 102. The spacer ring 124 can be press-fitted into the housing 102, for example. The spacer ring 124 can operate as an abutment or a locator on which the sealing grommet 122 is positioned. The spacer ring 124 also operates as a spacer that prevents contact between the sealing grommet 122 and the PCB 114. Further, in an example, the sensor 100 may include a retaining ring 126 to hold the sealing grommet 122 in position axially, i.e., retain the sealing grommet 122 in an axial direction (e.g., upward in FIGS. 1-3).

The sealing grommet 122 is configured as a first seal that protects the PCB 114. The sealing grommet 122 can also operate as an electric insulator for the PCB 114.

FIG. 5 illustrates a partial top view of the sensor 100, in accordance with an example implementation. Referring to FIGS. 1-3 and 5 together, the sealing grommet 122 has an axial hole 500. As depicted in FIG. 5, the axial hole 500 can be a central hole and is generally square or rectangular in shape. The axial hole 500 is aligned with the calibration connector 412 to provide access to the calibration connector 412 of the PCB 114, as shown in FIG. 5, during the calibration of the sensor 100.

The sealing grommet 122 also includes a first hole 502, a second holes 504, and a third hole 506 that can respectively correspond to the conductive points 406-410 of the PCB 114 shown in FIG. 4B. As such, wires of the external cable 120 are routed to or from the conductive points 406-410 through the holes 502-506. The term "external" is used herein to indicate that the external cable 120 provides a processed signal to an entity (e.g., a controller of a machine or other computing device) outside the sensor 100.

Although the external cable 120 is shown to be extending outside the housing 102 through the first end 106, in other examples, the wires of the external cable 120 can be routed to a side of the housing 102, where an external connector can be mounted to a side of the housing 102 and its pins can be connected to the wires. A plug can be coupled to such external connector to provide the processed signal to the entity outside the sensor 100.

Referring back to FIGS. 1-3, the sensor 100 further includes a grommet plug 128 that is positioned through the axial hole 500 of the sealing grommet 122. Once calibration is performed and access to the calibration connector 412 is no longer needed, the grommet plug 128 is positioned through the axial hole 500 of the sealing grommet 122 to form an air and fluid seal with the sealing grommet 122.

FIG. 6A illustrates a perspective view of the grommet plug 128, and FIG. 6B illustrates a cross-sectional elevational side view of the grommet plug 128, in accordance with an example implementation. The grommet plug 128 has a top portion 600 that is generally-rectangular, and has a projection 602 that is also shaped as a rectangular prism projecting or extending from the top portion 600.

The projection 602 has a blind hole 604 formed therein. Further, an exterior surface 605 of the projection 602 has one or more circumferential tapered ridges, such as ridge 606, ridge 608, and ridge 609. The projection 602 has annular grooves formed between the ridges 606, 608, 609. For example, an annular groove 610 is formed between the ridges 606, 608. These features of the grommet plug 128 facilitate forming a seal at the interface between the grommet plug 128 and the sealing grommet 122.

Figure 7:
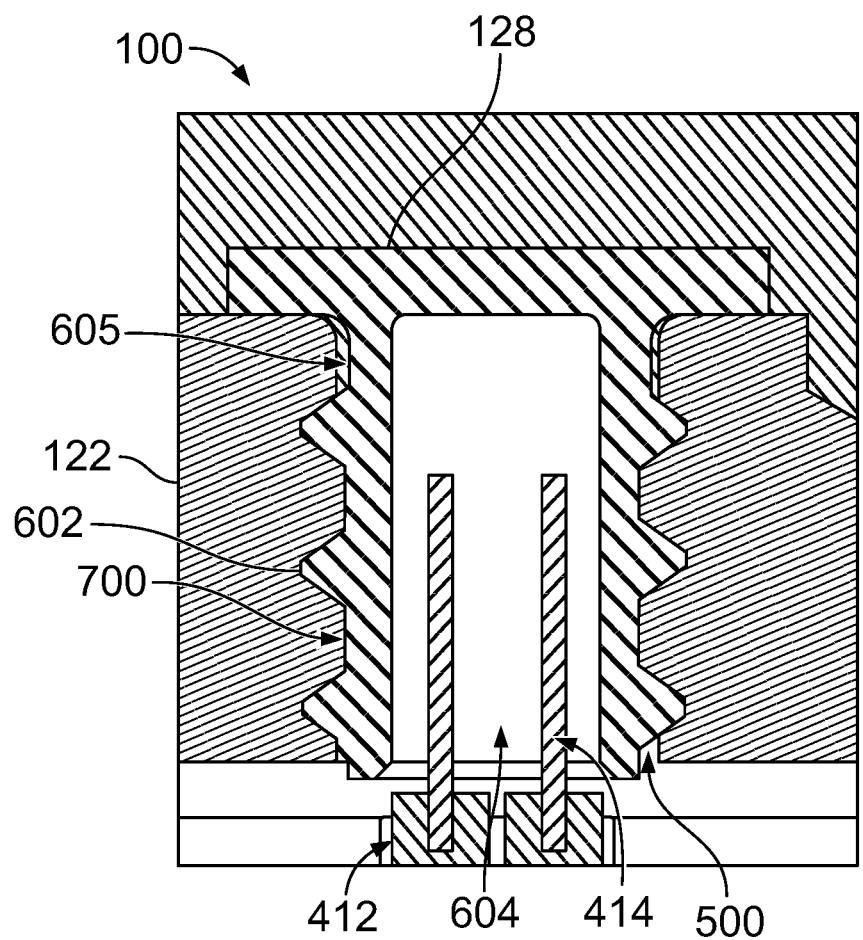
FIG. 7 illustrates a partial cross-sectional elevational view of the sensor of FIG. 1, in accordance with an example implementation.

FIG. 7 illustrates a partial cross-sectional elevational view of the sensor 100, in accordance with an example implementation. FIG. 7 represents a zoomed-in or enlarged view of the cross section depicted in FIG. 1. As shown in FIG. 7, the grommet plug 128 is inserted with the axial hole 500 of the sealing grommet 122. Further, the conductive pins 414 of the calibration connector 412 are received within the blind hole 604 of the grommet plug 128. As such, the grommet plug 128 receives at least a portion (e.g., the conductive pins 414) of the calibration connector 412.

As shown in FIG. 7, an interior surface 700 of the sealing grommet 122 that bounds or interacts with the exterior surface 605 of the projection 602 is drafted. In other words, the exterior surface 700 has tapered portions and troughs or grooves that correspond to the annular grooves (e.g., the annular groove 610) and ridges (e.g., the ridges 606, 608, 609) of the grommet plug 128.

With this configuration, the grommet plug 128 is gripped within the sealing grommet 122 such that the grommet plug 128 is secured in place (i.e., the grommet plug 128 is precluded from backing out). Further, the interaction between the ridges and grooves of the grommet plug 128 with the respective ridges and grooves of the sealing grommet 122 form a tight air and fluid seal that protects the PCB 114.

In addition to the sealing grommet 122 and the grommet plug 128 sealing the PCB 114 against external environment debris or fluids, the sealing effectiveness of the sensor 100 is enhanced by having an encapsulant sealing material 130 as shown in FIGS. 1-3. The encapsulant sealing material 130 is deposited (e.g., added or poured) through the first end 106 of the housing 102 and covers or encloses the retaining ring 126, the sealing grommet 122, the grommet plug 128, and the wires extending from the PCB 114 (connected to the conductive points 406-410) through the holes 502-506, and extending outside the sensor 100 via the external cable 120.

As such, the wires of the external cable 120 extend through the encapsulant sealing material 130 in a sealed manner. The wires of the external cable 120 are not shown through the encapsulant sealing material 130 in FIGS. 1-3. as they are immersed within or surrounded by the encapsulant sealing material 130. Once the encapsulant sealing material 130 is added, the sensor 100 is in its final form ready for use.

The encapsulant sealing material 130 operates as a primary seal that enhances sealing the sensor 100. Particularly, the encapsulant sealing material 130 provides sealing in addition to the sealing effect of the sealing grommet 122 and the grommet plug 128, thereby enhancing protection the PCB 114 against the external environment of the sensor 100. In an example, the encapsulant sealing material 130 comprises a potting compound suitable for sealing electronics. As an example for illustration, the encapsulant sealing material 130 can comprise a urethane potting compound that includes polyol and isocyanate.

In an example, the interior surface of the housing 102 bounding the encapsulant sealing material 130 can be knurled. For instance, a pattern of straight, angled or crossed lines can be machined into the interior surface of the housing 102 to facilitate adhesion of the encapsulant sealing material 130 to the interior surface of the housing 102.

In examples, the encapsulant sealing material 130 is configured to operate within a wide temperature range such as between −40 degree Celsius and 120 degree Celsius. The encapsulant sealing material 130 is also configured to be chemically-compatible with the materials of the sealing grommet 122 and the grommet plug 128. The encapsulant sealing material 130 is further configured to be resistant to environmental materials such as debris, hydraulic fluids/oils, diesel fuel, etc. In an example, the encapsulant sealing material 130 is a low viscosity material to facilitate displacement of air in the upper portion of the internal chamber 104 of the housing 102 as the encapsulant sealing material 130 is added.

Notably, the effective seal between the grommet plug 128 and the sealing grommet 122 allows for the encapsulant sealing material 130 to be poured or added through the first end 106 of the housing 102 to form an effective primary seal while precluding the encapsulant sealing material 130 from leaking to the PCB 114. Further, once the encapsulant sealing material 130 is added, access to the calibration connector 412 and the conductive pins 414 is no longer available, which advantageously preludes tampering with the calibration settings made during production of the sensor 100.

The sensor 100 can be any type of sensor used on a mobile machine (e.g., construction machines) or in an industrial facility, as examples. The sensing element 116 can vary based on the application and the parameter to be sensed.

In one example, the sensing element 116 comprises a Hall Effect sensor chip that can interact with a magnet placed on a movable member. When the movable member moves, the magnetic field of the magnet interacts with the Hall Effect sensor (i.e., the sensing element 116), which generates a voltage indicative of a position or speed of the movable member. As such, the sensor 100 can be a position and/or speed sensor.

In another example, the sensor 100 can be a pressure sensor. Although the end of the housing 102 where the sensing element 116 is placed is shown as closed, in other examples, the end is open to allow fluids to pass therethrough. In these examples, the sensing element 116 may be placed at a different location within the housing 102.

Figure 8:
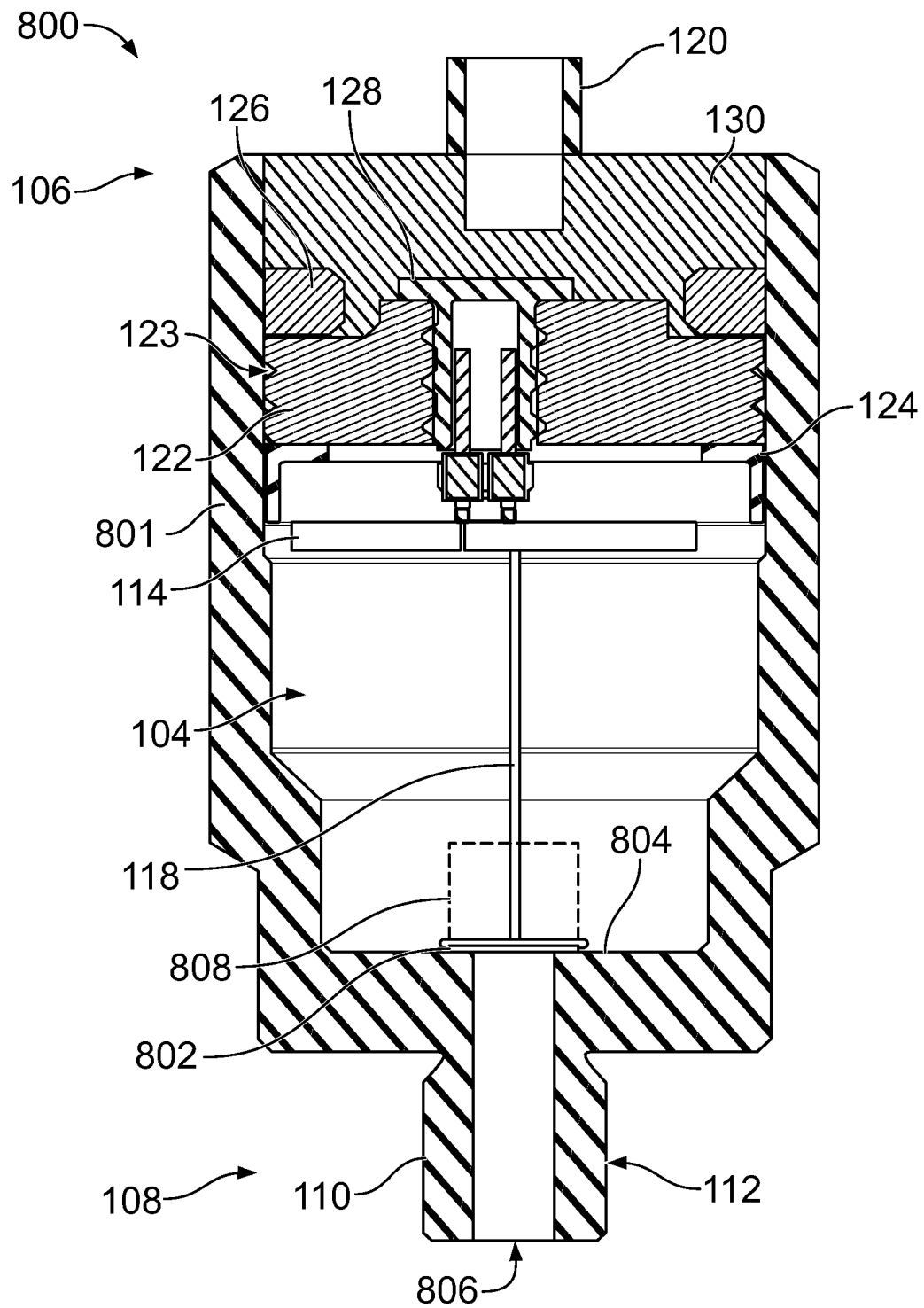
FIG. 8 illustrates a cross-sectional elevational view of another sensor, in accordance with an example implementation.

FIG. 8 illustrates a cross-sectional elevational view of another sensor 800, in accordance with an example implementation. The sensor 800 is similar to the sensor 100, and the same components of both sensors are designated with the same reference numbers.

As shown in FIG. 8, the sensor 800 has a sensing element 802 that is placed at a shoulder 804 formed by the interior surface of a housing 801 of the sensor 800. In an example, the end of the housing 801 can be open such that fluid is allowed to enter through a channel 806 formed in the housing 801. In this example, the sensing element 802 can be a strain gauge, for instance, which when subjected to fluid forces can provide a voltage or current to the PCB 114 indicative of pressure level of fluid in the channel 806. Thus, if the sensor 800 is mounted to a manifold or fluid line, it can provide an electric signal indicating pressure level of fluid.

In another example, the sensor 800 can be a temperature sensor that can indicate temperature of fluid, for instance. In another example, the sensing element 802 can include a piezo material that provides a voltage when compressed. Different voltage levels correspond to different compressive forces.

For example, a mass 808 can be placed on top of the sensing element 802 (e.g., the piezo element). In this example, the internal chamber 104 between the PCB 114 and the sensing element 802 can include air. The sensor 800 can be coupled to a machine or a component (e.g., a hydraulic pump) of a machine. When the machine moves or the component is operating, they may vibrate. Such vibration can cause the piezo element to be compressed at a particular frequency. The voltage signal produced by the piezo element may thus be indicative of a magnitude and frequency of vibration of the machine or component. The mass 808 is depicted with dashed line to indicate that it is an optional feature for some types of sensors. In this example, the end of the housing 801 may be closed similar to the housing 205, i.e., the channel 806 may be blocked.

Figure 9:
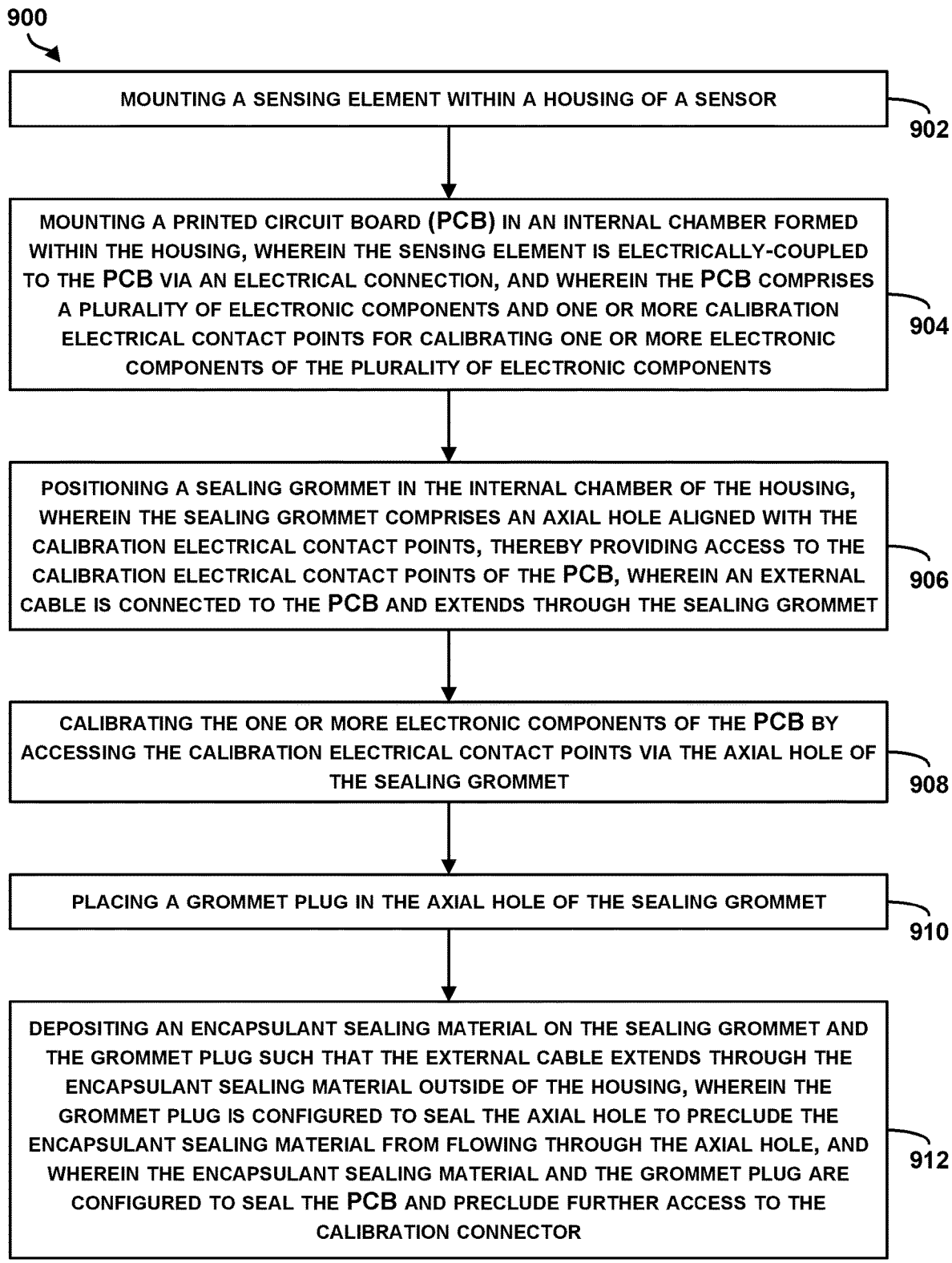
FIG. 9 is a flowchart of a method for calibrating and sealing a sensor, in accordance with an example implementation.

FIG. 9 is a flowchart of a method 900 for assembling a sensor, in accordance with an example implementation. For example, the method 900 can be used for assembling the sensor 100 or the sensor 800.

The method 900 may include one or more operations, or actions as illustrated by one or more of blocks 902-912, 1000, 1100, 1200, 1300, 1400, 1500, 1600, and 1700. Although the blocks are illustrated in a sequential order, these blocks may also be performed in parallel, and/or in a different order than those described herein. Also, the various blocks may be combined into fewer blocks, divided into additional blocks, and/or removed based upon the desired implementation. It should be understood that for this and other processes and methods disclosed herein, flowcharts show functionality and operation of one possible implementation of present examples. Alternative implementations are included within the scope of the examples of the present disclosure in which functions may be executed out of order from that shown or discussed, including substantially concurrent or in reverse order, depending on the functionality involved, as would be understood by those reasonably skilled in the art.

At block 902, the method 900 includes mounting the sensing element 116, 802 within the housing 102, 801 of the sensor 100, 800.

At block 904, the method 900 includes mounting the PCB 114 in the internal chamber 104 formed within the housing 102, 801, wherein the sensing element 116, 802 is electrically-coupled to the PCB 114 via the an electrical connection, and wherein the PCB 114 comprises a plurality of electronic components and one or more calibration electrical contact points (e.g., the calibration connector 412) for calibrating one or more electronic components of the plurality of electronic components.

At block 906, the method 900 includes positioning the sealing grommet 122 in the internal chamber 104 of the housing 102, 801, wherein the sealing grommet 122 comprises the axial hole 500 aligned with the calibration electrical contact points, thereby providing access to the calibration electrical contact points of the PCB 114, wherein the external cable 120 is connected to the PCB 114 and extends through the sealing grommet 122.

At block 908, the method 900 includes calibrating the one or more electronic components of the PCB 114 by accessing the calibration electrical contact points via the axial hole 500 of the sealing grommet 122.

At block 910, the method 900 includes placing the grommet plug 128 in the axial hole 500 of the sealing grommet 122.

At block 912, the method 900 includes depositing the encapsulant sealing material 130 on the sealing grommet 122 and the grommet plug 128 such that the external cable 120 extends through the encapsulant sealing material 130 outside of the housing 102, 801, wherein the grommet plug 128 is configured to seal the axial hole 500 to preclude the encapsulant sealing material 130 from flowing through the axial hole 500, and wherein the encapsulant sealing material 130 and the grommet plug 128 are configured to seal the PCB 114 and preclude further access to the calibration electrical contact points.

FIG. 10 is a flowchart of additional operations performed with the method 900 of FIG. 9, in accordance with an example implementation. In an example, the calibration electrical contact points can comprise the calibration connector 412, which includes a plurality of conductive pins, such as the conductive pins 414, and the grommet plug 128 has the blind hole 604. At block 1000, operations include placing the grommet plug 128 in the axial hole 500 of the sealing grommet 122 such that the grommet plug 128 receives the plurality of conductive pins in the blind hole 604 of the grommet plug 128.

FIG. 11 is a flowchart of additional operations performed with the method 900 of FIG. 9, in accordance with an example implementation. In an example, the calibration electrical contact points can comprise the calibration connector 412. The grommet plug 128 can include the top portion 600 and the projection 602 extending from the top portion 600. At block 1100, operations include inserting the projection 602 of the grommet plug 128 in the axial hole 500 of the sealing grommet 122 such that the grommet plug 128 receives a portion of the calibration connector 412 within the projection 602.

FIG. 12 is a flowchart of additional operations performed with the method 900 of FIG. 9, in accordance with an example implementation. The projection 602 can include one or more circumferential tapered ridges (e.g., the ridges 606, 608, 609), wherein an interior surface of the sealing grommet 122 bounding the axial hole 500 thereof is drafted. At block 1200, operations include inserting the projection 602 of the grommet plug 128 into the axial hole 500 of the sealing grommet 122 such that the interior surface of the sealing grommet 122 bounding the axial hole 500 grips the one or more circumferential tapered ridges of the projection 602 and forms a seal at an interface between the grommet plug 128 and the sealing grommet 122.

Figure 13:
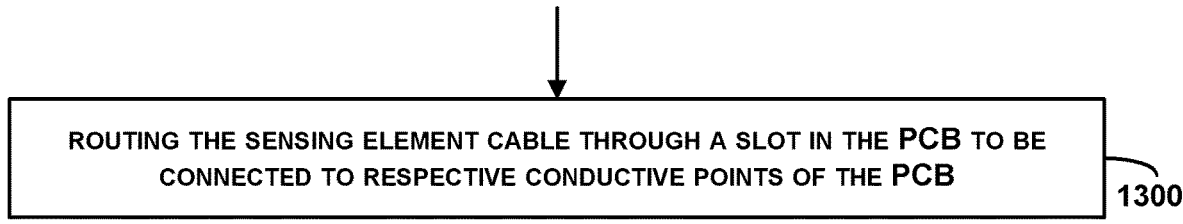
FIG. 13 is a flowchart of additional operations performed with the method of FIG. 9, in accordance with an example implementation.

FIG. 13 is a flowchart of additional operations performed with the method 900 of FIG. 9, in accordance with an example implementation. In an example, the electrical connection includes the sensing element cable 118 and the PCB 114 can include the slot 400. At block 1300, operations include routing the sensing element cable 118 through the slot 400 to be connected to respective conductive points (e.g., conductive points 402, 404) of the PCB 114.

Figure 14:
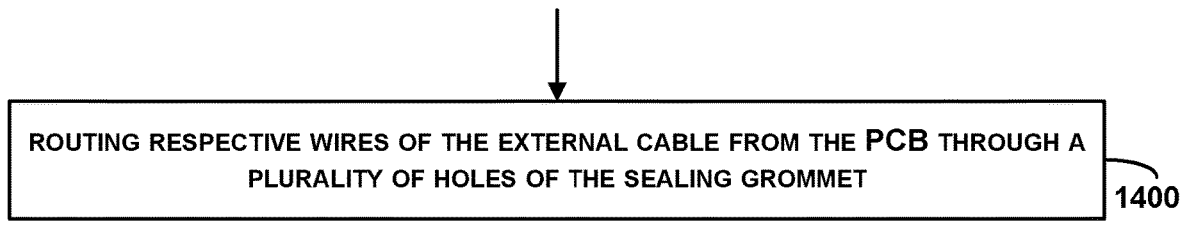
FIG. 14 is a flowchart of additional operations performed with the method of FIG. 9, in accordance with an example implementation.

FIG. 14 is a flowchart of additional operations performed with the method 900 of FIG. 9, in accordance with an example implementation. The sealing grommet 122 can further include a plurality of holes (e.g., the holes 502-506). At block 1400, operations include routing respective wires of the external cable 120 from the PCB 114 through the plurality of holes of the sealing grommet 122.

Figure 15:
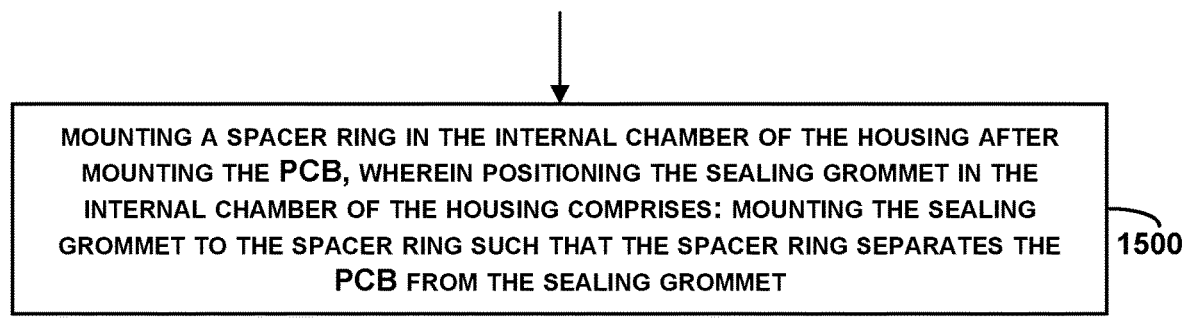
FIG. 15 is a flowchart of additional operations performed with the method of FIG. 9, in accordance with an example implementation.

FIG. 15 is a flowchart of additional operations performed with the method 900 of FIG. 9, in accordance with an example implementation. At block 1500, operations include mounting the spacer ring 124 in the internal chamber 104 of the housing 102, 801 after mounting the PCB 114, wherein positioning the sealing grommet 122 in the internal chamber 104 of the housing 102, 801 comprises: mounting the sealing grommet 122 to the spacer ring 124 such that the spacer ring 124 separates the PCB 114 from the sealing grommet 122.

FIG. 16 is a flowchart of additional operations performed with the method 900 of FIG. 9, in accordance with an example implementation. At block 1600, operations include mounting the retaining ring 126 in the internal chamber 104 to the sealing grommet 122 to retain the sealing grommet 122 in an axial direction.

FIG. 17 is a flowchart of additional operations performed with the method 900 of FIG. 9, in accordance with an example implementation. In an example, an exterior surface of the sealing grommet 122 is collared (see the collars 123). At block 1700, operations include positioning the sealing grommet 122 in the internal chamber 104 of the housing 102, 801 such that the exterior surface of the sealing grommet 122 grips an interior surface of the housing 102, 801.

The method can include other steps described herein.

The detailed description above describes various features and operations of the disclosed systems with reference to the accompanying figures. The illustrative implementations described herein are not meant to be limiting. Certain aspects of the disclosed systems can be arranged and combined in a wide variety of different configurations, all of which are contemplated herein.

Further, unless context suggests otherwise, the features illustrated in each of the figures may be used in combination with one another. Thus, the figures should be generally viewed as component aspects of one or more overall implementations, with the understanding that not all illustrated features are necessary for each implementation.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Further, devices or systems may be used or configured to perform functions presented in the figures. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner.

By the term "substantially" or "about" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

The arrangements described herein are for purposes of example only. As such, those skilled in the art will appreciate that other arrangements and other elements (e.g., machines, interfaces, operations, orders, and groupings of operations, etc.) can be used instead, and some elements may be omitted altogether according to the desired results. Further, many of the elements that are described are functional entities that may be implemented as discrete or distributed components or in conjunction with other components, in any suitable combination and location.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. Also, the terminology used herein is for the purpose of describing particular implementations only, and is not intended to be limiting.

Embodiments of the present disclosure can thus relate to one of the enumerated example embodiments (EEEs) listed below.

EEE 1 is a sensor comprising: a housing having an internal chamber; a printed circuit board (PCB) mounted in the internal chamber of the housing, wherein the PCB comprises one or more calibration electrical contact points; a sealing grommet mounted in the internal chamber, wherein the sealing grommet comprises an axial hole aligned with the calibration electrical contact points, thereby providing access to the calibration electrical contact points of the PCB; a grommet plug disposed in the axial hole of the sealing grommet; a sensing element disposed in the housing and electrically-coupled to the PCB via an electrical connection; an encapsulant sealing material deposited on the sealing grommet and the grommet plug, wherein the grommet plug is configured to seal the axial hole to preclude the encapsulant sealing material from flowing through the axial hole, and to preclude access to the calibration electrical contact points once encapsulant sealing material is deposited; and an external cable connected to the PCB and extending through the sealing grommet and through the encapsulant sealing material.

EEE 2 is the sensor of EEE 1, wherein the calibration electrical contact points comprise a calibration connector having a plurality of conductive pins, and wherein the grommet plug has a blind hole receiving the plurality of conductive pins therein.

EEE 3 is the sensor of any of EEEs 1-2, wherein the calibration electrical contact points comprise a calibration connector, and wherein the grommet plug comprises: a top portion and a projection extending from the top portion into the axial hole of the sealing grommet, wherein the grommet plug receives the portion of the calibration connector within the projection.

EEE 4 is the sensor of EEE 3, wherein the top portion is rectangular in shape and wherein the projection is configured as a rectangular prism.

EEE 5 is the sensor of any of EEEs 3-4, wherein the projection comprises one or more circumferential tapered ridges.

EEE 6 is the sensor of EEE 5, wherein an interior surface of the sealing grommet bounding the axial hole thereof is drafted such that the interior surface of the sealing grommet bounding the axial hole grips the one or more circumferential tapered ridges of the projection and forms a seal at an interface between the grommet plug and the sealing grommet.

EEE 7 is the sensor of any of EEEs 1-6, wherein the electrical connection comprises a sensing element cable, and wherein the PCB comprises a slot through which the sensing element cable is routed to be connected to respective conductive points of the PCB.

EEE 8 is the sensor of any of EEEs 1-7, wherein the sealing grommet further comprises a plurality of holes through which respective wires of the external cable are routed.

EEE 9 is the sensor of any of EEEs 1-8, further comprising: a spacer ring mounted in the internal chamber of the housing between the PCB and the sealing grommet.

EEE 10 is the sensor of any of EEEs 1-9, further comprising: a retaining ring mounted to the sealing grommet and configured to retain the sealing grommet in an axial direction.

EEE 11 is the sensor of any of EEEs 1-10, wherein an exterior surface of the sealing grommet is collared to facilitate gripping an interior surface of the housing.

EEE 12 is a method comprising: mounting a sensing element within a housing of a sensor; mounting a printed circuit board (PCB) in an internal chamber formed within the housing, wherein the sensing element is electrically-coupled to the PCB via an electrical connection, and wherein the PCB comprises a plurality of electronic components and one or more calibration electrical contact points for calibrating one or more electronic components of the plurality of electronic components; positioning a sealing grommet in the internal chamber of the housing, wherein the sealing grommet comprises an axial hole aligned with the one or more calibration electrical contact points, thereby providing access to the one or more calibration electrical contact points of the PCB, wherein an external cable is connected to the PCB and extends through the sealing grommet; calibrating the one or more electronic components of the PCB by accessing the one or more calibration electrical contact points via the axial hole of the sealing grommet; placing a grommet plug in the axial hole of the sealing grommet; and depositing an encapsulant sealing material on the sealing grommet and the grommet plug such that the external cable extends through the encapsulant sealing material outside of the housing, wherein the grommet plug is configured to seal the axial hole to preclude the encapsulant sealing material from flowing through the axial hole, and wherein the encapsulant sealing material and the grommet plug are configured to seal the PCB and preclude further access to the calibration electrical contact points.

EEE 13 is the method of EEE 12, wherein the calibration electrical contact points comprise a calibration connector having a plurality of conductive pins, and wherein the grommet plug has a blind hole, and wherein placing the grommet plug in the axial hole of the sealing grommet comprises: placing the grommet plug in the axial hole of the sealing grommet such that the grommet plug receives the plurality of conductive pins in the blind hole of the grommet plug.

EEE 14 is the method of any of EEEs 12-13, wherein the calibration electrical contact points comprise a calibration connector, wherein the grommet plug comprises a top portion and a projection extending from the top portion, wherein placing the grommet plug in the axial hole of the sealing grommet comprises: inserting the projection of the grommet plug in the axial hole of the sealing grommet such that the grommet plug receives the portion of the calibration connector within the projection.

EEE 15 is the method of EEE 14, wherein the projection comprises one or more circumferential tapered ridges, wherein an interior surface of the sealing grommet bounding the axial hole thereof is drafted, wherein placing the grommet plug in the axial hole of the sealing grommet comprises: inserting the projection of the grommet plug into the axial hole of the sealing grommet such that the interior surface of the sealing grommet bounding the axial hole grips the one or more circumferential tapered ridges of the projection and forms a seal at an interface between the grommet plug and the sealing grommet.

EEE 16 is the method of any of EEEs 12-15, wherein the electrical connection comprises a sensing element cable, and wherein the PCB comprises a slot, and wherein the method further comprises: routing the sensing element cable through the slot to be connected to respective conductive points of the PCB.

EEE 17 is the method of any of EEEs 12-16, wherein the sealing grommet further comprises a plurality of holes, and wherein the method further comprises: routing respective wires of the external cable from the PCB through the plurality of holes of the sealing grommet.

EEE 18 is the method of any of EEEs 12-17, further comprising: mounting a spacer ring in the internal chamber of the housing after mounting the PCB, wherein positioning the sealing grommet in the internal chamber of the housing comprises: mounting the sealing grommet to the spacer ring such that the spacer ring separates the PCB from the sealing grommet.

EEE 19 is the method of any of EEEs 12-18, further comprising: mounting a retaining ring in the internal chamber to the sealing grommet to retain the sealing grommet in an axial direction.

EEE 20 is the method of any of EEEs 12-19, wherein an exterior surface of the sealing grommet is collared, and wherein positioning the sealing grommet in the internal chamber of the housing comprises: positioning the sealing grommet in the internal chamber of the housing such that the exterior surface of the sealing grommet grips an interior surface of the housing.

What is claimed is:
1. A sensor comprising:
 a housing having an internal chamber;
 a printed circuit board (PCB) mounted in the internal chamber of the housing, wherein the PCB comprises one or more calibration electrical contact points;
 a sealing grommet mounted in the internal chamber, wherein the sealing grommet comprises an axial hole aligned with the calibration electrical contact points, thereby providing access to the calibration electrical contact points of the PCB;
 a grommet plug disposed in the axial hole of the sealing grommet;
 a sensing element disposed in the housing and electrically-coupled to the PCB via an electrical connection;
 an encapsulant sealing material deposited on the sealing grommet and the grommet plug, wherein the grommet plug is configured to seal the axial hole to preclude the encapsulant sealing material from flowing through the axial hole, and to preclude access to the calibration electrical contact points once the encapsulant sealing material is deposited; and
 an external cable connected to the PCB and extending through the sealing grommet and through the encapsulant sealing material.

2. The sensor of claim 1, wherein the calibration electrical contact points comprise a calibration connector having a plurality of conductive pins, and wherein the grommet plug has a blind hole receiving the plurality of conductive pins therein.

3. The sensor of claim 1, wherein the calibration electrical contact points comprise a calibration connector, and wherein the grommet plug comprises:
 a top portion and a projection extending from the top portion into the axial hole of the sealing grommet, wherein the grommet plug receives a portion of the calibration connector within the projection.

4. The sensor of claim 3, wherein the top portion is rectangular in shape and wherein the projection is configured as a rectangular prism.

5. The sensor of claim 3, wherein the projection comprises one or more circumferential tapered ridges.

6. The sensor of claim 5, wherein an interior surface of the sealing grommet bounding the axial hole thereof is drafted such that the interior surface of the sealing grommet bounding the axial hole grips the one or more circumferential tapered ridges of the projection and forms a seal at an interface between the grommet plug and the sealing grommet.

7. The sensor of claim 1, wherein the electrical connection comprises a sensing element cable, and wherein the PCB comprises a slot through which the sensing element cable is routed to be connected to respective conductive points of the PCB.

8. The sensor of claim 1, wherein the sealing grommet further comprises a plurality of holes through which respective wires of the external cable are routed.

9. The sensor of claim 1, further comprising:
a spacer ring mounted in the internal chamber of the housing between the PCB and the sealing grommet.

10. The sensor of claim 1, further comprising:
a retaining ring mounted to the sealing grommet and configured to retain the sealing grommet in an axial direction.

11. The sensor of claim 1, wherein an exterior surface of the sealing grommet is collared to facilitate gripping an interior surface of the housing.

12. A method comprising:
mounting a sensing element within a housing of a sensor;
mounting a printed circuit board (PCB) in an internal chamber formed within the housing, wherein the sensing element is electrically-coupled to the PCB via an electrical connection, and wherein the PCB comprises a plurality of electronic components and one or more calibration electrical contact points for calibrating one or more electronic components of the plurality of electronic components;
positioning a sealing grommet in the internal chamber of the housing, wherein the sealing grommet comprises an axial hole aligned with the calibration electrical contact points, thereby providing access to the calibration electrical contact points of the PCB, wherein an external cable is connected to the PCB and extends through the sealing grommet;
calibrating the one or more electronic components of the PCB by accessing the calibration electrical contact points via the axial hole of the sealing grommet;
placing a grommet plug in the axial hole of the sealing grommet; and
depositing an encapsulant sealing material on the sealing grommet and the grommet plug such that the external cable extends through the encapsulant sealing material outside of the housing, wherein the grommet plug is configured to seal the axial hole to preclude the encapsulant sealing material from flowing through the axial hole, and wherein the encapsulant sealing material and the grommet plug are configured to seal the PCB and preclude further access to the calibration electrical contact points.

13. The method of claim 12, wherein the calibration electrical contact points comprise a calibration connector having a plurality of conductive pins, and wherein the grommet plug has a blind hole, and wherein placing the grommet plug in the axial hole of the sealing grommet comprises:
placing the grommet plug in the axial hole of the sealing grommet such that the grommet plug receives the plurality of conductive pins in the blind hole of the grommet plug.

14. The method of claim 12, wherein the calibration electrical contact points comprise a calibration connector, wherein the grommet plug comprises a top portion and a projection extending from the top portion, wherein placing the grommet plug in the axial hole of the sealing grommet comprises:
inserting the projection of the grommet plug in the axial hole of the sealing grommet such that the grommet plug receives a portion of the calibration connector within the projection.

15. The method of claim 14, wherein the projection comprises one or more circumferential tapered ridges, wherein an interior surface of the sealing grommet bounding the axial hole thereof is drafted, wherein placing the grommet plug in the axial hole of the sealing grommet comprises:
inserting the projection of the grommet plug into the axial hole of the sealing grommet such that the interior surface of the sealing grommet bounding the axial hole grips the one or more circumferential tapered ridges of the projection and forms a seal at an interface between the grommet plug and the sealing grommet.

16. The method of claim 12, wherein the electrical connection comprises a sensing element cable, and wherein the PCB comprises a slot, and wherein the method further comprises:
routing the sensing element cable through the slot to be connected to respective conductive points of the PCB.

17. The method of claim 12, wherein the sealing grommet further comprises a plurality of holes, and wherein the method further comprises:
routing respective wires of the external cable from the PCB through the plurality of holes of the sealing grommet.

18. The method of claim 12, further comprising:
mounting a spacer ring in the internal chamber of the housing after mounting the PCB, wherein positioning the sealing grommet in the internal chamber of the housing comprises:
mounting the sealing grommet to the spacer ring such that the spacer ring separates the PCB from the sealing grommet.

19. The method of claim 12, further comprising:
mounting a retaining ring in the internal chamber to the sealing grommet to retain the sealing grommet in an axial direction.

20. The method of claim 12, wherein an exterior surface of the sealing grommet is collared, and wherein positioning the sealing grommet in the internal chamber of the housing comprises:
positioning the sealing grommet in the internal chamber of the housing such that the exterior surface of the sealing grommet grips an interior surface of the housing.

* * * * *